(12) United States Patent
Biber (10) Patent No.: US 9,766,308 B2
(45) Date of Patent: Sep. 19, 2017

(54) MAGNETIC RESONANCE UNIT, A MAGNETIC RESONANCE APPARATUS WITH THE MAGNETIC RESONANCE UNIT, AND A METHOD FOR DETERMINATION OF A MOVEMENT BY A PATIENT DURING A MAGNETIC RESONANCE EXAMINATION

(71) Applicant: Stephan Biber, Erlangen (DE)

(72) Inventor: Stephan Biber, Erlangen (DE)

(73) Assignee: SIEMENS HEALTHCARE GMBH, Erlanger (GB)

( * ) Notice: Subject to any disclaimer, the term of this patent is extended or adjusted under 35 U.S.C. 154(b) by 728 days.

(21) Appl. No.: 14/024,767

(22) Filed: Sep. 12, 2013

(65) Prior Publication Data
US 2014/0070807 A1    Mar. 13, 2014

(30) Foreign Application Priority Data

Sep. 13, 2012 (DE) .................. 10 2012 216 292

(51) Int. Cl.
*G01R 33/56* (2006.01)
*G01R 33/30* (2006.01)
(Continued)

(52) U.S. Cl.
CPC ............ *G01R 33/30* (2013.01); *G01R 33/48* (2013.01); *G01R 33/56509* (2013.01); *G01R 33/3692* (2013.01)

(58) Field of Classification Search
CPC ...... G03G 33/30; G03G 33/48; G03G 33/565; G01R 33/56509; G01R 33/283;
(Continued)

(56) References Cited

U.S. PATENT DOCUMENTS 7,945,304 B2 * 5/2011 Feinberg .................. A61B 8/08
                                                     324/309
8,121,361 B2   2/2012 Armstrong
(Continued)

FOREIGN PATENT DOCUMENTS

DE    102007034955 A1   2/2009
WO    WO 2007063516 A2   6/2007
(Continued)

OTHER PUBLICATIONS

Qin et al, Prospective Head Movement of Correction for High Resolution MRI using an In-Bore Optical Tracking System, Magn Reson Med. 2009.*
(Continued)

*Primary Examiner* — Clayton E LaBalle
*Assistant Examiner* — Ruifeng Pu (57) ABSTRACT

A magnetic resonance unit with a housing unit and a patient accommodation area for the accommodation and/or holding of at least one part region of a patient is provided. The patient accommodation area is surrounded at least partially by the housing unit, a first and a second movement sensor unit for acquiring a first and a second item of movement information of a movement of the patient. The first movement sensor unit exhibits a first field of view for the acquisition of a first part region of the patient and/or of the patient accommodation area, and the second movement sensor unit exhibits a second field of view for the acquisition of a second part region of the patient and/or of the patient accommodation area, which is formed differently in relation to the first part region of the patient and/or of the patient accommodation area.

18 Claims, 3 Drawing Sheets

(51) Int. Cl.
*G01R 33/48* (2006.01)
*G01R 33/565* (2006.01)
*G01R 33/36* (2006.01)

(58) Field of Classification Search
CPC ...... G01R 33/28; G01R 33/5673; G01R 33/5676; A61B 5/055; A61B 5/721; A61B 6/037; A61B 5/113; A61B 5/7285
See application file for complete search history.

(56) References Cited

U.S. PATENT DOCUMENTS

| | | | | |
|---|---|---|---|---|
| 8,144,962 | B2* | 3/2012 | Busch | G06T 11/006 378/4 |
| 9,002,079 | B2* | 4/2015 | Sachs | A61B 5/721 382/128 |
| 2002/0118373 | A1* | 8/2002 | Eviatar | G01R 33/283 356/614 |
| 2004/0054248 | A1* | 3/2004 | Kimchy | A61B 5/055 600/3 |
| 2005/0283068 | A1* | 12/2005 | Zuccolotto | A61B 5/0555 600/410 |
| 2007/0096028 | A1* | 5/2007 | Tanaka | G01T 1/1642 250/363.07 |
| 2007/0280508 | A1* | 12/2007 | Ernst | A61B 5/055 382/107 |
| 2008/0029704 | A1* | 2/2008 | Hefetz | A61B 6/037 250/363.01 |
| 2008/0205730 | A1* | 8/2008 | Stehning | G01R 33/3415 382/131 |
| 2009/0010514 | A1* | 1/2009 | Kimura | G01R 33/56509 382/131 |
| 2009/0177076 | A1* | 7/2009 | Aldefeld | G01R 33/56375 600/410 |
| 2010/0166274 | A1* | 7/2010 | Busch | G06T 11/006 382/131 |
| 2010/0198112 | A1* | 8/2010 | Maad | A61B 6/0457 600/595 |
| 2011/0105883 | A1* | 5/2011 | Lake | A61B 5/0059 600/410 |
| 2011/0230755 | A1* | 9/2011 | MacFarlane | A61B 5/055 600/414 |
| 2011/0230792 | A1* | 9/2011 | Sarig-Bahat | A61B 5/1124 600/595 |
| 2012/0051664 | A1* | 3/2012 | Gopalakrishnan | G06T 11/005 382/294 |
| 2012/0268124 | A1* | 10/2012 | Herbst | G01R 33/5673 324/309 |
| 2012/0288143 | A1* | 11/2012 | Ernst | A61B 5/055 382/103 |
| 2012/0305780 | A1* | 12/2012 | Thiruvenkadam | A61B 6/037 250/363.03 |
| 2013/0035588 | A1* | 2/2013 | Shea | G01R 33/4833 600/413 |
| 2014/0012127 | A1* | 1/2014 | Biber | A61B 5/6817 600/411 |
| 2014/0064585 | A1* | 3/2014 | Wollenweber | G06T 11/005 382/131 |
| 2014/0070807 | A1* | 3/2014 | Biber | G01R 33/56509 324/309 |
| 2014/0073904 | A1* | 3/2014 | Biber | A61B 6/527 600/410 |
| 2014/0073908 | A1* | 3/2014 | Biber | G01R 33/56308 600/415 |
| 2014/0221812 | A1* | 8/2014 | Heismann | A61B 5/113 600/407 |
| 2014/0378816 | A1* | 12/2014 | Oh | G01R 33/283 600/409 |
| 2015/0016682 | A1* | 1/2015 | Levy | A61N 7/02 382/103 |
| 2015/0077113 | A1* | 3/2015 | Benner | A61B 5/721 324/318 |
| 2015/0126799 | A1* | 5/2015 | Vahala | A61N 5/1049 600/1 |
| 2015/0139515 | A1* | 5/2015 | Smith | A61B 6/032 382/131 |
| 2015/0157277 | A1* | 6/2015 | Goto | A61B 5/7285 600/413 |
| 2015/0208946 | A1* | 7/2015 | Popescu | A61B 5/6892 600/415 |
| 2015/0265220 | A1* | 9/2015 | Ernst | A61B 6/527 600/411 |
| 2015/0323637 | A1* | 11/2015 | Beck | G01R 33/4828 600/410 |
| 2015/0366527 | A1* | 12/2015 | Yu | A61B 5/055 382/131 |
| 2016/0035108 | A1* | 2/2016 | Yu | G06T 7/2093 382/131 |
| 2016/0038090 | A1* | 2/2016 | Heismann | A61B 5/0059 600/410 |
| 2016/0073962 | A1* | 3/2016 | Yu | A61B 5/721 600/407 |
| 2016/0073975 | A1* | 3/2016 | Hefetz | A61B 6/037 600/427 |

FOREIGN PATENT DOCUMENTS

WO   WO 2009129457 A1   10/2009
WO   WO 2012143826 A1   10/2012

OTHER PUBLICATIONS

Kober et al.: "Head Motion Detection Using FID Navigators", Magnetic Resonance in Medicine 66:135-143 (2011); 2011.
Prospective Head-Movement Correction for HighResolution MRI Using an In-Bore Optical Tracking System; Prospective Head-Movement Correction for HighResolution MRI Using an In-Bore Optical Tracking System Lei Qin, Peter van Gelderen, John Andrew Derbyshire, Fenghua Jin, Jongho Lee, Jacco A, de Zwart, Yang Tao, and Jeff H, Duyn.
Prospective Motion Correction for MRI with a Single Retro-Grate Reflector Target and a Single Camera; Prospective Motion Correction for MRI with a Single Retro-Grate Reflector Target and a Single Camera M. Zaitsev, B. S. Armstrong, B. Andrews-Shigaki et. al.

* cited by examiner

MAGNETIC RESONANCE UNIT, A MAGNETIC RESONANCE APPARATUS WITH THE MAGNETIC RESONANCE UNIT, AND A METHOD FOR DETERMINATION OF A MOVEMENT BY A PATIENT DURING A MAGNETIC RESONANCE EXAMINATION

CROSS REFERENCE TO RELATED APPLICATIONS

This application claims priority to German application No. 10 2012 216 292.5 DE filed Sep. 13, 2012, the entire content of which is hereby incorporated herein by reference.

FIELD OF INVENTION

The present invention is based on a magnetic resonance unit with a housing unit, a patient accommodation area for the accommodation and/or holding of at least one part region of a patient for a magnetic resonance examination, wherein the patient accommodation area is at least partially surrounded by the housing unit, a first movement sensor unit, which is designed for the acquisition of a first item of movement information regarding a movement by the patient, and at least one second movement sensor unit, which is designed for the acquisition of a second item of movement information regarding the movement of the patient.

BACKGROUND OF INVENTION

For magnetic resonance imaging it is important that a patient does not make any movements for the entire duration of the magnetic resonance examination, in particular in a region of the patient which is relevant to the magnetic resonance examination. Movements by the patient during the magnetic resonance examination can produce artifacts in the magnetic resonance images, which can then lead to an erroneous interpretation during a medical evaluation of the magnetic resonance images, and/or to a reduction in their interpretation value. It may, moreover, be necessary for the magnetic resonance examination to be repeated. Particularly with magnetic resonance examinations of patients inclined to claustrophobia and/or patients suffering from pain and/or children, it is often difficult for the patient to remain lying motionless for the duration of the magnetic resonance examination.

Methods are already known with which a movement of the body of the patient can be acquired by means of the magnetic resonance examination, and subsequently a change is made in the course of a measurement sequence, such as, for example, an adjustment of a gradient plane. Such methods, however, must be developed individually for each magnetic resonance sequence.

It is further known to acquire the movement of the patient by means of a sensor unit. Thus, for example, from U.S. Pat. No. 8,121,361 B2 an apparatus is known for the acquisition of a movement by a patient, with which marking elements, in particular optical marking elements, are arranged on the patient. A position of these marking elements is acquired by means of a detection unit, and from this a change in position and/or a movement of the patient is identified. In this situation, however, before the magnetic resonance examination, the patient must be prepared for such a measurement by medical service personnel, which leads to a time-consuming preparation phase for the magnetic resonance examination.

An apparatus is also known from U.S. Pat. No. 7,945,304 B2 with which, by means of an ultrasound unit, organs of the patient are measured, wherein for this purpose a detector unit must rest directly against the tissue of the patient. Such a measurement, however, is difficult to carry out due to the restricted amount of space available, since in most cases for a magnetic resonance examination a local magnetic resonance coil rests directly against and/or at a short distance from the region of the patient which is to be examined.

SUMMARY OF INVENTION

The present invention is based in particular on the object of making possible a particularly reliable acquisition of a movement of a patient during a magnetic resonance examination. The object is achieved by the features of the independent claims. Advantageous embodiments are described in the dependent claims.

The invention is based on a magnetic resonance unit with a housing unit, a patient accommodation area to accommodate and/or hold at least one part region of the patient for a magnetic resonance examination, wherein the patient accommodation area is at least partially surrounded by the housing unit, a first movement sensor unit, which is designed for the acquisition of a first item of movement information regarding a movement by the patient, and at least one second movement sensor unit, which is designed for the acquisition of a second item of movement information regarding the movement of the patient.

It is proposed that the first movement sensor unit exhibits a first field of view for the acquisition of a first part region of the patient and/or of the patient accommodation area, and the at least one second movement sensor unit exhibits a second field of view for the acquisition of a second part region of the patient and/or of the patient accommodation area, which is designed differently in relation to the first part region of the patient and/or the patient accommodation area. As a result, a movement of the patient can be determined ad/or acquired by means of the at least two movement sensor units from different perspectives in relation to the patient, and thereby a particularly reliable and efficient acquisition and/or determination of the movement of the patient during the magnetic resonance examination can be achieved. In this situation, it is also possible, in particular, for rotational movements as well as translational movements of the patient to be reliably acquired. Additionally, by means of the at least two movement sensor units, the movement of the patient during the magnetic resonance examination can be acquired by redundant means, and/or measurement errors and/or measurement imprecisions can be eliminated from the acquired movement data of the at least two movement sensor units.

In this connection, the term patient accommodation area of the magnetic resonance unit should be understood to mean, in particular, an area at least partially surrounded by the housing unit, which is specially designed for the accommodation and/or holding of the patient. This patient accommodation area is, at least during the magnetic resonance examination, arranged inside a detection region of the magnetic resonance apparatus which is relevant to the magnetic resonance examination, such that a field of view (FOV) of the magnetic resonance apparatus during the magnetic resonance examination coincides at least partially with the patient accommodation area. In addition, the term field of view of one of the movement sensor units should be understood to mean in particular an optical region acquired by the movement sensor unit along an optical axis of the movement sensor unit. The fields of view of the individual movement sensor units can at least partially overlap one another. The movement sensor units are designed for the acquisition of sensor data, wherein the sensor data is formed in particular from non-magnetic resonance data.

It is further proposed that the at least two movement sensor units are arranged on the housing unit, as a result of which additional structural parts and/or additional structural space for the arrangement and/or securing of the at least two movement sensor units can advantageously be saved.

Particularly advantageously, the at least two movement sensor units are arranged outside the patient accommodation area, as a result of which an area is advantageously available without restriction to the patient for the holding and/or positioning of the patient. Preferably, the at least two movement sensor units are arranged on the housing unit, in particular in an area arranged on a side facing away from the patient accommodation area, wherein, for this purpose, the housing unit can exhibit a transparent and/or radiation-permeable region, such that radiation emitted and/or to be detected by the at least two movement sensor units can be reliably acquired by the housing unit for the acquisition of an item of movement information. In addition, the sensor signal can also be transferred by means of a signal transfer unit into the patient accommodation area and/or from the patient accommodation area to the movement sensor unit, wherein the signal transfer unit can comprise, for example, optical fibers for the signal transfer of the sensor signals.

In an advantageous further development of the invention, it is proposed that the first movement sensor unit and/or the at least one second movement sensor unit comprises at least one item of movement information regarding the movement of the patient, by means of a run time measurement of at least one sensor signal. It is possible in this way, in particular, for a distance to be acquired from the first movement sensor unit and/or from the at least one second movement sensor unit to a part region of the patient arranged inside the patient accommodation area. Additionally, in this way a particularly exact acquisition of the movement of the patient can be achieved, with a high location resolution. By means of the run-time measurement, preferably a sensor signal is emitted by the movement sensor unit, which is then reflected from the part region of the patient arranged inside the patient accommodation area, and detected by the movement sensor unit. Moreover, the use of optical marking elements, which must be fitted to the patient before the magnetic resonance examination, can be advantageously avoided, and in this way the work load can be reduced for medical operating personnel, such as a physician and/or an operator conducting the magnetic resonance examination for the preparation of the patient for the magnetic resonance examination.

It is further proposed that the first movement sensor unit and/or the at least one second movement sensor unit comprises an optical movement sensor unit. As a result, a high degree of precision can be achieved in the acquisition of the movement information by means of the first movement sensor unit and/or the at least one second movement sensor unit. In addition, the use of optical marking elements on the patient can advantageously be avoided.

A particularly cost-effective magnetic resonance unit can be attained if the optical movement sensor unit comprises an optical 1D movement sensor element or an optical 2D movement sensor element. Preferably, the optical 1D movement sensor element is designed for the acquisition of an item of movement information along a single dimension and/or a single direction, and the optical 2D movement sensor element is designed for the acquisition of an item of movement information along two dimensions and/or two directions, in particular a 2D sensor data measurement field.

It is further proposed that the first movement sensor unit and/or the at least one second movement sensor unit comprises an ultrasound sensor unit. As a result of this, a particularly reliable and simple acquisition of the movement information regarding the movement of the patient can be achieved. Preferably, the acquisition of the movement information takes place by means of a run-time measurement of ultrasound signals and/or a frequency modulation of ultrasound signals. Alternatively or additionally, the acquisition of the movement information by means of the ultrasound sensor unit can also comprise a continuous wave method, with which the carrier signals can be switched on and off, wherein an item of information is transferred by a sequence and/or a rhythm of transmitted signals and pauses. Preferably, in this situation the ultrasound sensor unit is arranged at a distance from the patient inside the magnet unit, and preferably outside the patient accommodation area of the magnetic resonance unit.

Alternatively or additionally, the acquisition of the movement information regarding the movement of the patient can take place by means of an optical pattern by the first movement sensor unit and/or the at least one second movement sensor unit. In this situation, for example, patterns, particularly strips, are projected on the patient, particularly on a part region of the patient which is relevant to the magnetic resonance examination and/or on a part region of the patient which is relevant to a movement acquisition, and acquired by the movement sensor units. On the basis of a change in the pattern, for example on the basis of a change in a size and/or a change in a position and/or a change in a pattern shape, an item of movement information regarding the movement of the patient can be determined.

A particularly exact acquisition of an item of movement information regarding the movement of the patient can advantageously be attained if the first movement sensor unit and/or the at least one second movement sensor unit acquires the movement information regarding the movement of the patient with a resolution of maximum 5 mm. Preferably, the movement information regarding the movement of the patient is acquired with a resolution of maximum 3 mm and particularly preferably with a resolution of between 0.1 mm to maximum 1.0 mm.

In an advantageous further development of the invention, it is proposed that the magnetic resonance unit comprises an evaluation unit, as a result of which a change in the position of the patient and/or a movement of the patient can be determined particularly rapidly and directly on the basis of the sensor data. Provision can additionally be made for each of the movement sensor units to comprise its own evaluation unit.

The invention is further based on a magnetic resonance apparatus with a magnet unit, which comprises a main magnet, a gradient coil unit, and a high-frequency antenna unit, a patient accommodation area, which is at least partially surrounded by the magnet unit, a patient holding apparatus, which is movably arranged inside the patient accommodation area, and at least one magnetic resonance unit as claimed in one of claims 1 to 10. As a result, a movement of the patient can thereby be determined and/or acquired by means of the at least two movement sensor units from different perspectives in relation to the patient, and therefore a particularly reliable and efficient acquisition and/or determination of the movement of the patient during the magnetic resonance examination can be attained. In this situation, moreover, rotational movements and translational movements of the patient can in particular be reliably acquired. Additionally, by means of the at least two movement sensor units, the movement of the patient during the magnetic resonance examination can be acquired in a redundant manner, and/or measurement errors and/or measurement imprecisions can be eliminated from the acquired movement data of the at least two movement sensor units. The at least one magnetic resonance unit is preferably designed to be magnetic-resonance compatible.

Particularly advantageously, the high-frequency antenna unit comprises the magnetic resonance unit, as a result of which a movement of the patient can be acquired particularly simply in a region relevant to the magnetic resonance examination. Preferably, the high-frequency antenna unit is installed fixed inside the magnet unit, such that the first movement sensor unit and the at least one second movement sensor unit are available for each magnetic resonance measurement for a movement measurement.

It is further proposed that the magnetic resonance apparatus exhibits a local magnetic resonance coil apparatus which includes the magnetic resonance unit, as a result of which a movement of the patient can be acquired directly in a region which is relevant to the magnetic resonance measurement, in particular inside the patient accommodation area of the local coil apparatus. The local magnetic resonance coil apparatus can be formed, for example, from a head coil apparatus, an arm coil apparatus, a knee coil apparatus, etc.

Alternatively or additionally to this, the magnetic resonance unit can also be encompassed by the patient holding apparatus, as a result of which every movement of the patient positioned on the patient holding apparatus can be advantageously acquired.

The invention is further based on a method for a determination of a movement of a patient during a magnetic resonance examination, comprising the following method steps:
- an acquisition of magnetic resonance data before the magnetic resonance examination by means of a magnet unit,
- an evaluation of the magnetic resonance data, wherein a three-dimensional spatial arrangement is determined of objects inside the patient accommodation area,
- a determination of a distance between at least one movement sensor unit and a patient inside the patient accommodation area by means of the three-dimensional spatial arrangement,
- an acquisition of sensor data by means of the at least one movement sensor unit during the magnetic resonance examination, and
- a determination of a movement of the patient on the basis of the acquired sensor data.

In this way a movement of the patient during the magnetic resonance examination can be acquired particularly rapidly and directly, and therefore also a reaction carried out in response to the movement during the magnetic resonance examination, such as, for example, by means of a change to and/or adjustment of a value of a magnetic field gradient and/or by a repetition of a part measurement of the magnetic resonance examination, etc. In this connection, the acquisition of magnetic resonance data should be understood to mean in particular an acquisition of data, preferably of 3D data, an overview measurement, and/or a navigator measurement by means of the magnet unit, wherein, by means of the data, a three-dimensional structure and/or three-dimensional arrangement inside the patient accommodation area can be determined. Additionally, a three-dimensional spatial arrangement should be understood to mean in particular a three-dimensional spatial structure inside the patient accommodation area. Additionally, objects arranged inside the patient accommodation area should be understood to mean in particular a patient, such as a part region of the patient, and/or a local magnetic resonance coil apparatus and/or one or more movement sensor units and/or positioning units for the positioning of the patient on the patient accommodation apparatus etc. The sensor data acquired by means of the at least one movement sensor unit is preferably formed from 1D sensor data and/or from 2D sensor data, in particular a 2D sensor data measurement field. Based on the combination of the magnetic resonance data acquired before the magnetic resonance examination, in particular 3D magnetic resonance data, and the sensor data, in particular the 1D sensor data and/or 2D sensor data, it is possible, at low cost, to carry out a reliable and exact determination of a movement of the patient. Preferably, for this purpose the movement sensor unit exhibits several movement sensor elements for the acquisition of the 1D sensor data and/or 2D sensor data.

It is further proposed that the sensor data be acquired from at least two movement sensor units positioned differently in relation to the patient. As a result of this, a movement of the patient can be determined and/or acquired by means of the at least two movement sensor units from different perspectives in relation to the patient, and therefore a particularly reliable acquisition and/or determination of the movement of the patient during the magnetic resonance examination can be achieved. In this situation, rotational movements can also be effectively acquired as well as translational movements of the patient. Additionally, by means of the at least two movement sensor units, the movement of the patient during the magnetic resonance examination can be acquired in a redundant manner, and/or measurement errors and/or measurement imprecisions can be eliminated from the acquired movement data of the at least two movement sensor units.

If the movement of the patient is calculated by means of a model calculation and/or a fitting method, wherein the sensor data acquired and the three-dimensional spatial arrangement determined from the magnetic resonance data are introduced into the model calculation and/or into the fitting method, it is possible in this way, particularly rapidly and reliably, to back-calculate to the movement of the patient, wherein a lower number of different measurement data can be introduced into the calculation in comparison with a number of degrees of freedom of the movement of the patient which is to be acquired. Additionally, in this situation the movement of the patient can be acquired and/or determined particularly cost-effectively, since it is possible to advantageously avoid having a large number of movement sensor units, wherein every degree of freedom of the patient movement must be covered by a sensor value.

In a further embodiment of the invention it is proposed that, after the determination of the movement of the patient, a plausibility check is made of the movement of the patient which is to be determined. As a result of this, the number of the movements of the patient determined by means of the model calculation and/or the fitting method can be reduced, and preferably restricted to a probable movement of the patient. For this purpose, several sensor data and/or sensor signals, acquired in the temporal respect one after another, can be used to check the plausibility of the movement which is to be determined. For example, by means of the sensor data and the model calculation and/or the fitting method, a movement trajectory can be determined and/or calculated, wherein the subsequent sensor signals must lie on this movement trajectory.

It is further proposed that, depending on the acquired movement of the patient, a movement correction is carried out. In this way it is possible to react particularly rapidly to the position change and/or to the movement of the patient during the magnetic resonance examination. For example, with only slight movements the movement corrections can be carried out as late as during an evaluation of the magnetic resonance examination.

Alternatively or additionally, the movement correction can comprise changes in a measurement sequence of the magnetic resonance examination. In this situation, individual part measurements can be repeated and/or interrupted, until the patient has again assumed a motionless position. In this way it is possible, as early as during the magnetic resonance examination, for individual part sections of the magnetic resonance examination which are unusable for a diagnostic and/or medicinal evaluation to be identified and repeated. It is additionally possible for individual sequences, such as, for example, magnetic field gradient sequences, to be adjusted and/or corrected as a function of the movement of the patient.

Provision can also be made for the acquired movement of the patient to represent an actuation criterion and/or a start criterion for at least one part area of the magnetic resonance measurement. Thus, for example, the at least one part area of the magnetic resonance measurement can only be started if the patient makes no or only slight movements. In this way, an acquisition can be advantageously prevented of magnetic resonance data which is unusable for a diagnostic and/or medicinal evaluation.

BRIEF DESCRIPTION OF THE DRAWINGS

Further advantages, features, and details of the invention are derived from the exemplary embodiment described hereinafter, as well as on the basis of the drawings. These show.

DETAILED DESCRIPTION OF INVENTION

Figure 1:
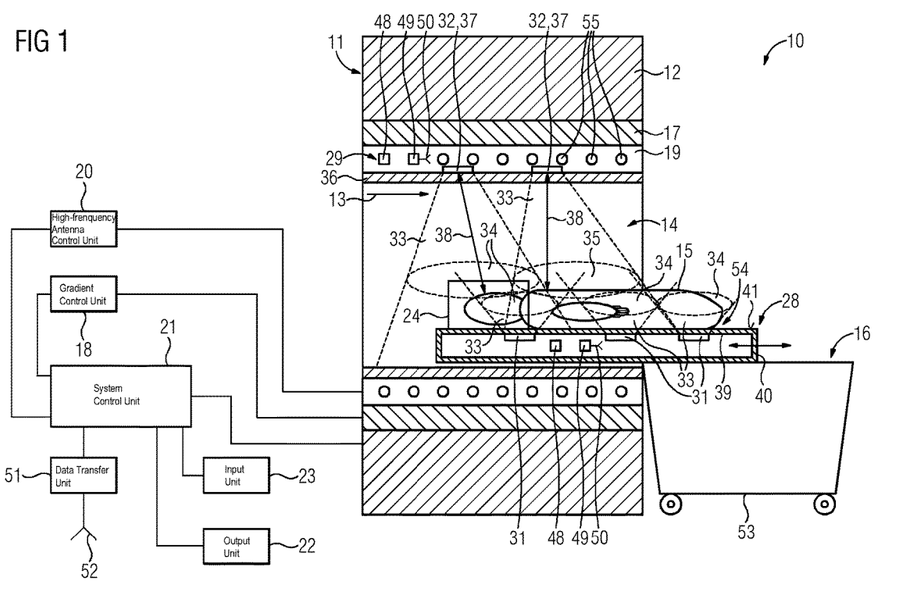
FIG. 1 a magnetic resonance apparatus in a diagrammatic representation.

Shown in FIG. 1 is a magnetic resonance apparatus 10 according to the invention. The magnetic resonance apparatus 10 comprises a magnet unit 11 with a main magnet 12 for generating a powerful and, in particular, constant main magnetic field 13. Additionally, the magnetic resonance apparatus 10 exhibits a cylindrical patient accommodation area 14, for the accommodation of a patient 15, wherein the patient accommodation area 14 is enclosed in a circumferential direction by the magnet unit 11. The patient 15 can be moved into the patient accommodation area 14 by means of a patient holding apparatus 16 of the magnetic resonance apparatus 10.

The magnet unit 11 further exhibits a gradient coil unit 17 for generating magnetic field gradients, which are used for spatial encoding during an imaging process. The gradient coil unit 17 is actuated by way of a gradient control unit 18.

In addition, the magnet unit 11 exhibits a high-frequency antenna unit 19 integrated fixedly inside the magnet unit 11, and a high-frequency antenna control unit 20 for excitation of a polarization, which develops in the main magnetic field 13 generated by the main magnet 12. The high-frequency antenna unit 19 is controlled by the high-frequency antenna control unit 20, and emits high-frequency magnetic resonance sequences in an examination space, which is essentially formed by the patient accommodation area 14. As a result, the magnetization is deflected out of its position of equilibrium.

In order to control the main magnet 12, the gradient control unit 18, and to control the high-frequency antenna control unit 20, the magnetic resonance apparatus 10 exhibits a system control unit 21 formed from a computer unit. The system control unit 21 controls the magnetic resonance apparatus 10 centrally, such as, for example, the carrying out of a predetermined imaging magnetic field gradient echo sequence. Control information, such as, for example, imaging parameters, as well as reconstructed magnetic resonance images, can be displayed on a display unit 22, such as a monitor, of the magnetic resonance apparatus 10. Additionally, the magnetic resonance apparatus 10 exhibits an input unit 23, by means of which the items of information and/or parameters can be input by an operator during a measurement procedure.

Figure 2:
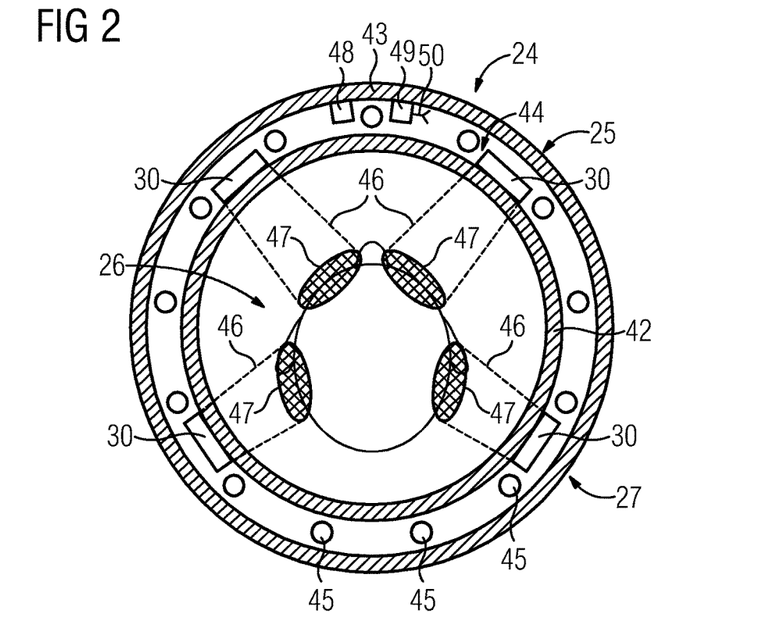
FIG. 2 a section through a head coil apparatus.
Figure 3:
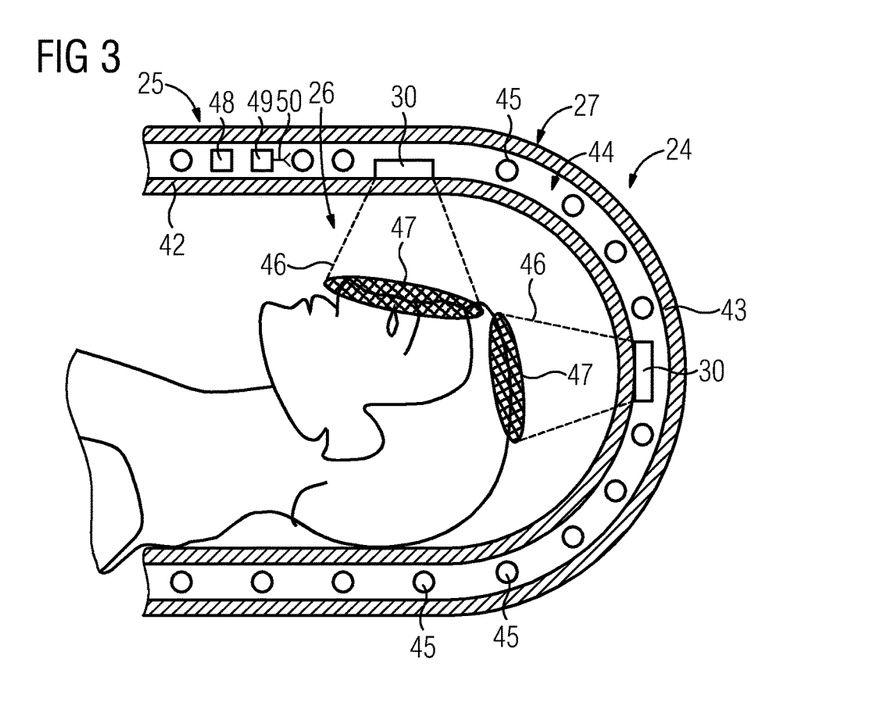
FIG. 3 an alternative section to FIG. 2 through the head coil apparatus.

The magnetic resonance apparatus 10 further exhibits a local magnetic resonance coil apparatus 24, which in the present exemplary embodiment is formed by a head coil apparatus. As an alternative to this, the local magnetic resonance coil apparatus 24 can also be formed by a knee coil apparatus, an arm coil apparatus, a chest coil apparatus etc. The head coil apparatus comprises a housing unit 25, which surrounds a local patient accommodation area 26 of the head coil apparatus in a dome-shaped fashion (FIGS. 2 and 3).

In order to acquire a movement of the patient 15 during a magnetic resonance examination, the magnetic resonance apparatus 10 exhibits a plurality of magnetic resonance units 27, 28, 29, which in each case comprise a plurality of movement sensor units 30, 31, 32 (FIG. 1). A first magnetic resonance unit 29 is composed of the high-frequency antenna unit 19, a second magnetic resonance unit 28 is composed of the patient holding apparatus 16, and a third magnetic resonance unit 27 is composed of the head coil apparatus 24. Alternatively, the magnetic resonance apparatus 10 can also comprise only one or two magnetic resonance units 27, 28, 29, which are composed of the high-frequency antenna unit 19 and/or the patient holding apparatus 16 and/or the local magnetic resonance coil apparatus 24.

The high-frequency antenna unit 19, in particular the magnetic resonance unit 29 of the high-frequency antenna unit 19, includes a plurality of movement sensor units 32, wherein in FIG. 1 only two of the movement sensor units 32 are represented by way of example. The movement sensor units 32 are in each case designed to acquire an item of movement information of a movement of the patient 15, wherein to this end the movement sensor units 32 acquire sensor data which is formed from non-magnetic resonance data. The two movement sensor units 32 in each case comprise an optical field of view 33 for the acquisition in each case of a part region 34, 35 of the patient, wherein a first optical field of view 33 of a first of the two movement sensor units 32 is aimed at a first part region 34 of the patient 15 or of the patient accommodation area 14 respectively, and a second optical field of view 33 of a second of the two movement sensor units 32 is aimed at a second part region 35 of the patient 15 or of the patient accommodation area 14 respectively. The first part region 34 of the patient 15 or of the patient accommodation area 14 respectively, and the second part region 35 of the patient 15 or of the patient accommodation area 14 respectively are additionally arranged at different positions on the patient 15 or inside the patient accommodation area 14 respectively. The two movement sensor units 32 therefore exhibit different perspectives in relation to the patient accommodation area 14, in particular to the patient 15 arranged inside the patient accommodation area 14, for the acquisition of an item of movement information of the movement of the patient 15.

The different optical fields of view 33 of the movement sensor units 32 are arranged on the high-frequency antenna unit 19 in such a way that the optical fields of view 33 overlap at peripheral areas. Accordingly, the two part regions 34, 35, of the patient 15 or of the patient accommodation area 14 respectively, acquired by means of the movement sensor units 32, also overlap.

The high-frequency antenna unit 19, in particular the magnetic resonance unit 29 of the high-frequency antenna unit 19, comprises a housing unit 36, which surrounds the patient accommodation area 14 of the magnetic resonance apparatus 10 in cylindrical fashion. The two movement sensor units 32 are arranged at the housing unit 36, wherein the two movement sensor units 32 are arranged in an area of the high-frequency antenna unit 19 which is arranged on a side of the housing unit 36 which faces away from the patient accommodation area 14. Accordingly, the two movement sensor units 32 are arranged outside the patient accommodation area 14.

Also arranged in this area of the high-frequency antenna unit 19 are further high-frequency antenna elements 55 of the high-frequency antenna unit 19, which can, for example, comprise a coil identification unit and/or a frequency pulling circuit and/or a matching circuit and/or a power supply and/or a voltage source and/or individual antenna elements, etc.

For reliable sending of sensor data into the patient accommodation area 14 and/or reliable acquisition of sensor data, the housing unit 36 can comprise, for example, transparent and/or radiation-permeable part areas, which are designed as transparent and/or radiation permeable in particular for sensor signals emitted by the movement sensor units 32 and/or sensor signals to be received by the movement sensor units 32. As an alternative to this, it is also conceivable that, additionally, the sensor signals emitted by the movement sensor units 32 and/or sensor signals to be received by the movement sensor units 32 are transferred by means of optical fibers from the patient accommodation area 14 to the movement sensor units 32.

The two movement sensor units 32 are designed in such a way that in this situation they can acquire an item of movement information of the movement of the patient 15 with a resolution of maximum 5 mm. Preferably, however, the movement information of the movement of the patient 15 is acquired with a resolution of maximum 3 mm and particularly advantageously with a resolution of between 0.1 mm to maximum 1.0 mm. In addition, the two movement sensor units 32 comprise in each case an optical movement sensor unit 32. The optical movement sensor units 32 in each case comprise an optical movement sensor element 37, which can be formed from an optical 1D movement sensor element 37 and/or an optical 2D movement sensor element 37. By means of the optical 1D movement sensor elements 37 and/or the optical 2D movement sensor elements 37, an item of movement information of the movement of the patient 15 inside the patient accommodation area 14 is acquired along one dimension and/or along two dimensions, in particular a 2D sensor data measuring field. For example, the optical 1D movement sensor elements 37 and/or the optical 2D movement sensor elements 37 comprise a laser system for the acquisition of the movement information of the movement of the patient 15. Further embodiments of the optical movement sensor elements 37, which appear to the person skilled in the art as practicable, are also possible.

By means of the two optical movement sensor elements 37, the movement information of the movement of the patient 15 is acquired by means of a run-time measurement of the sensor signals, and from this a distance 38 between the movement sensor elements 37 and the patient 15 is determined. To this end, optical sensor signals are emitted by the optical movement sensor elements 37 in the direction of the patient 15, and are reflected at the respective part region 34, 35 of the patient 15. The reflected sensor signals are then acquired by the optical movement sensor elements 37. As an alternative to this, provision can also be made for only one of the optical movement sensor elements 37 to emit an optical sensor signal, and the other of the optical movement sensor elements 37 acquires the reflected optical sensor signal.

Moreover, the optical movement sensor units 32, in particular the optical movement sensor elements 37, are designed for the acquisition of the movement information of the movement of the patient 15 by means of the acquisition of an optical pattern, for example an optical strip pattern. During a change in the position of the patient 15 and/or a movement of the patient 15 inside the patient accommodation area 14, the optical pattern therefore also changes, wherein this change can comprise a change of a value and/or a change in a position of the pattern and/or of part areas of the pattern. This change is acquired by the optical movement sensor units 32.

The magnetic resonance unit 29 of the high-frequency antenna unit 19 exhibits an evaluation unit 48 and a data transfer unit 49. The data transfer unit 49 comprises a data transmitter unit with an antenna element 50 for cableless and/or wireless data transfer. By means of the data transfer unit 49 the evaluated sensor data and/or the sensor data received by the movement sensor units 32 are transferred to a data transfer unit 51 of the system control unit 21. The data transfer unit 51 of the system control unit 21 comprises a data reception unit with an antenna element 52 for cableless and/or wireless data transfer.

The patient holding apparatus 16 comprises a holding couch 40, which is movably arranged inside the patient accommodation area 14 of the magnetic resonance apparatus 10. Additionally, the patient holding apparatus 16 exhibits a base unit 53, on which the holding couch 40 is movably arranged. The patient 15 is held on a holding surface 41 of the holding couch for the magnetic resonance examination. A patient accommodation area 54 and/or a patient holding area of the patient holding apparatus 16 is arranged on a side of the holding couch 40 facing away from the base unit, such that the patient accommodation area 54 and/or patient holding area of the patient holding apparatus 16 is delimited downwards by the holding couch 40. For a magnetic resonance examination, the patient, together with the holding couch 40, is moved into the patient accommodation area 14 of the magnetic resonance apparatus 10, such that the patient accommodation area 54 of the patient holding apparatus 16 overlaps at least partially with the patient accommodation area 14 of the magnetic resonance apparatus 10.

For the acquisition of a movement of the patient 15 during a magnetic resonance examination, the patient holding apparatus 16, in particular the magnetic resonance unit 28 of the patient holding apparatus 16, likewise exhibits a plurality of movement sensor units 31, wherein in FIG. 1, by way of example, only three of the movement sensor units 31 are represented. The movement sensor units 31 are likewise formed by optical movement sensor units 31. A further embodiment of the individual movement sensor units 31 is analogous to the description of the embodiment of the movement sensor units 32 of the high-frequency antenna unit 19.

The movement sensor units 31 of the patient holding apparatus 16 are arranged inside the holding couch 40, but outside the patient accommodation area 54 of the patient holding apparatus 16. The holding couch 40 exhibits a housing unit 39, which at least partially surrounds the patient accommodation area 54 of the patient holding apparatus 16. The arrangement of the movement sensor units 31 inside the patient holding apparatus 16 is analogous to the description of the arrangement of the movement sensor units 32 inside the high-frequency antenna unit 19, wherein each of the movement sensor units 32 of the patient holding apparatus 14 also exhibits an optical field of view 33, in order to acquire a part region 34 of the patient 14 and/or of the patient accommodation area 54 of the patient holding apparatus 16. The individual optical fields of view 33 of the individual movement sensor units 31 can in this situation likewise at least partially overlap, such that the part regions 34 of the patient 15 and/or of the patient accommodation area 54 of the patient holding apparatus 16 acquired by the movement sensor units 31 at least partially overlap.

The magnetic resonance unit 28 of the patient holding apparatus 14 exhibits an evaluation unit 48 and a data transfer unit 49, wherein the data transfer unit 49 comprises a data transmitter unit with an antenna element 50 for cableless and/or wireless data transfer.

The head coil apparatus, in particular the magnetic resonance unit 27 of the head coil apparatus, likewise comprises a plurality of movement sensor units 30, as is represented in particular in FIGS. 2 and 3 in greater detail. The head coil apparatus in the present exemplary embodiment exhibits six movement sensor units 30. These six movement sensor units 30 are formed in the present case by ultrasound sensor units. It is also conceivable that the head coil apparatus comprises optical movement sensor units instead of ultrasound sensor units, or a combination of ultrasound sensor units and optical movement sensor units. Accordingly, it is also conceivable that the movement sensor units 31, 32 of the patient holding apparatus 16 and/or of the high-frequency antenna unit 19 comprise ultrasound sensor units and/or a combination of ultrasound sensor units and optical movement sensor units. It is also possible that the movement sensor units 30, 31, 32 comprise at least partially a camera and/or other movement sensor units 30, 31, 32 which appear practical to the person skilled in the art for the acquisition of the movement information of the movement of the patient 15.

The individual ultrasound sensor units in this situation acquire the movement information of the movement of the patient 15 by means of a run-time measurement. Additionally, the acquisition of the movement information of the movement of the patient 15 can also be carried out by means of a frequency modulation of the transmitted and received sensor signals and/or by means of a continuous wave method for the transmission of sensor signals and/or by means of other methods which appear practicable to the person skilled in the art. The run-time measurement by means of the individual ultrasound sensor units is carried out analogously to the description of the run-time measurement in FIG. 1.

The housing unit 25 of the head coil apparatus comprises an inner housing unit 42 and an outer housing unit 43, wherein between the inner housing unit 42 and the outer housing unit 43 a closed structural space 44 of the head coil apparatus is located, in which are arranged high-frequency coil elements 45 for the acquisition of magnetic resonance signals. The high-frequency coil elements 45 can comprise, for example, a coil identification unit and/or a frequency pulling circuit and/or a matching circuit and/or a power supply and/or a voltage source and/or individual antenna elements etc.

The six movement sensor units 30 are likewise arranged between the inner housing unit 42 and the outer housing unit 43, wherein the movement sensor units 30 exhibit in each case a different viewing angle from the other movement sensor units 30 onto the patient 15 and/or the local patient accommodation area 26 of the head coil apparatus, such that a position of the patient 15 inside the local patient accommodation area 26 of the head coil apparatus can be acquired from different perspectives. The different movement sensor units 30 comprise in each case an optical field of view 46 for the acquisition in each case of a part region 47 of the patient 15, wherein a first optical field of view 46 of a first of the two movement sensor units 30 is aimed at a first part region 47 of the patient 15, and a second optical field of view 46 of a second of the two movement sensor units 30 is aimed at a second part region 47 of the patient 15. The first part region 47 of the patient 15 and the second part region 47 of the patient 15 are additionally arranged at different positions on the patient 15, wherein the individual part regions 47 can overlap in peripheral areas.

The movement sensor units 32 of the magnetic resonance unit 27 are designed in such a way that in this situation they can acquire an item of movement information of the movement of the patient 15 with a resolution of maximum 5 mm. Preferably, however, the movement information of the movement of the patient 15 is acquired with a resolution of maximum 3 mm and particularly advantageously with a resolution of between 0.1 mm to a maximum of 1.0 mm.

The individual movement sensor units 30 are arranged in such a way at the head coil unit that the part regions 47 acquired by the movement sensor units 30 comprise in particular a head front side of the patient 15 and/or a face of the patient 15 and a head upper side of the patient 15, such that the regions of the head of the patient 15 which are relevant for a movement are acquired.

The magnetic resonance unit 27, 29 exhibits an evaluation unit 48 and a data transfer unit 49. The data transfer unit 49 comprises a data transmitter unit with an antenna element 50, for a cableless and/or wireless data transfer. By means of the data transfer unit 49, the evaluated sensor data and/or the sensor data received by the movement sensor units 30, 31, 32 is transferred to a data transfer unit 51 of the system control unit 21.

For the determination of a movement of the patient 15, by means of the magnetic resonance units 27, 28, 29 and the system control unit 21, a method according to the invention for the determination of a movement of the patient 15 is carried out during a magnetic resonance examination. This method for the determination of the movement of the patient 15 is shown in greater detail in FIG. 4. The system control unit 21 and the evaluation units 48 of the individual magnetic resonance units 27, 28, 29 are specially designed for carrying out the method for the determination of a movement of the patient 15 during the magnetic resonance examination, wherein, for this purpose, the system control unit 21 and the evaluation units 48 comprise special computer programs and special software units, which are stored in a memory unit, not shown in greater detail, of the system control unit 21 and/or of the evaluation units 48, and are run on a processor, not shown in greater detail, of the system control unit 21 and/or of the evaluation units 48.

Figure 4:
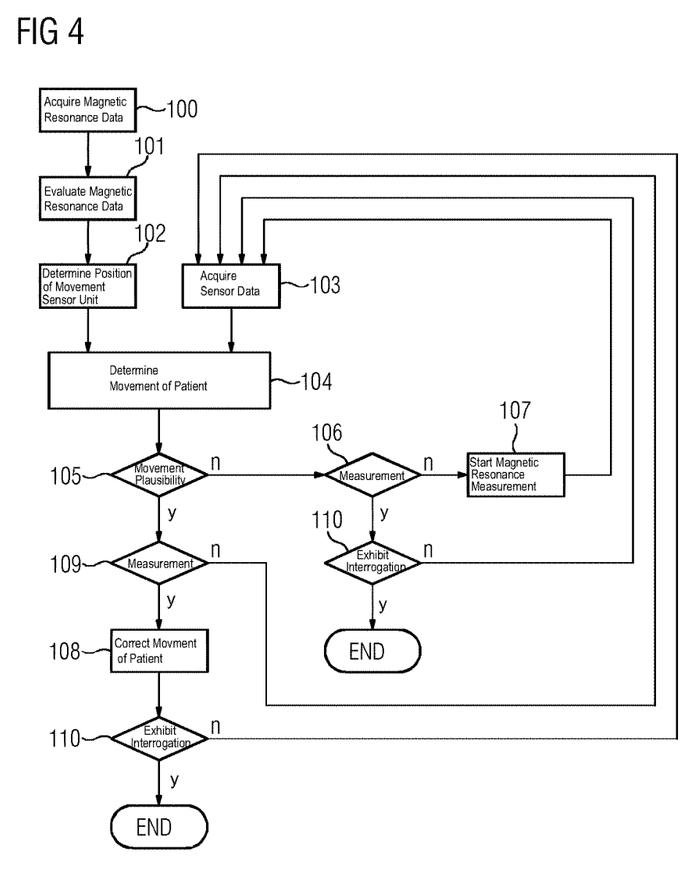
FIG. 4 a diagrammatic sequence plan of a method according to the invention for the determination of a movement of the patient.

With this method, first, in a first method step 100, a first magnetic resonance measurement is carried out by means of the magnet unit 11, wherein the first magnetic resonance measurement is carried out before the magnetic resonance examination on the patient 15. This first magnetic resonance measurement is formed from an overview measurement, for example from a navigator measurement. By means of the first magnetic resonance measurement, in this first method step 100 3D magnetic resonance data is acquired. In a further method step 101, the 3D measurement data acquired by means of the first magnetic resonance measurement is evaluated, wherein the evaluation is carried out by the system control unit 21, which for this purpose comprises an evaluation unit, not shown in greater detail. In the evaluation step, a three-dimensional spatial arrangement of the objects arranged inside the patient accommodation area 14, in particular of the patient 14 and, if appropriate, the movement sensor units 30, is determined and/or acquired from the acquired 3D magnetic resonance data from the first magnetic resonance measurements. In a further method step 102, by means of the three-dimensional spatial arrangement determined inside the patient accommodation area 14, the distance 38 from each of the movement sensor units 30, 31, 32 to the patient 15 is determined. The position of the individual movement sensor units 30, 31, 32 can in this situation be determined from the three-dimensional spatial arrangement and/or read out from a database.

In a further method step 103, an acquisition of sensor data is carried out by means of the movement sensor units 30, 31, 32, and in a following method step 104 a movement of the patient 15 is calculated on the basis of the acquired sensor data and from the three-dimensional spatial arrangement determined from the 3D magnetic resonance data. The sensor data from the movement sensor units 30, 31, 32 comprises 1D sensor data and/or 2D sensor data, in particular a 2D sensor data measuring field. In this situation, first the acquired 1D sensor data and/or 2D sensor data from the movement sensor units 30, 31, 32 is transferred by means of the data transfer units 49, 41 to the system control unit 21 of the magnetic resonance apparatus 10. The 1D sensor data and/or 2D sensor data is evaluated inside the evaluation unit of the system control unit 21. For the evaluation, a model calculation and/or a fitting method is used, wherein the acquired 1D sensor data and/or 2D sensor data and the three-dimensional spatial arrangement of objects inside the patient accommodation areas 14 determined from the magnetic resonance data are included in the model calculation and/or into the fitting method.

Provided only one of the magnetic resonance units 27, 28, 29 is used for the acquisition of the movement of the patient 15, the evaluation can also at least in part be carried out by the evaluation unit 48 of the magnetic resonance unit 48.

After a movement of the patient 15 has been determined, a plausibility interrogation of the acquired movement of the patient 15 is carried out in a further method step 105. To check the plausibility of the acquired movement of the patient 15, the 1D sensor data and/or 2D sensor data acquired one after another in the temporal respect are taken into account, wherein a movement trajectory, determined and/or acquired by means of the model calculation and/or the fitting method, for the determination and/or acquisition of the movement of the patient, must include the 1D sensor data and/or 2D sensor data acquired one after another in the temporal respect.

If this plausibility criterion is not fulfilled, this will be registered inside the system control unit 21 as a non-movement of the patient 15. If this plausibility criterion is fulfilled, a movement of the patient 15 is acquired.

Provided that the magnetic resonance examination has not yet started, the plausibility criterion can serve as a start criterion and/or as an actuation criterion for the magnetic resonance examination of the patient 15. It will be determined in a further interrogation 106 whether the magnetic resonance examination has already been started, and, depending on the result of the interrogation 106, the magnetic resonance measurement will be started in a further method step 107. In this situation, for example, the magnetic resonance examination will only be started if no movement is made by the patient 15, in particular in a part region of the patient 15 which is relevant to the magnetic resonance examination.

During the magnetic resonance examination, by means of the movement sensor units 30, 31, 32, movement information will also be acquired in the method step 103, such that, during the magnetic resonance examination constant monitoring can also be maintained with regard to a movement of the patient 15.

Additionally, during the magnetic resonance examination, a movement correction is carried out in a further method step 108 by means of the system control unit 21 of the magnetic resonance apparatus 10, as a function of the acquired movement of the patient 15. To this end, an interrogation 109 will again be carried out beforehand as to whether the magnetic resonance examination has already been started. If the magnetic resonance measurement has not yet started, a sensor signal will again be sent by means of the movement sensor units 30, 31, 32. If the magnetic resonance examination has already started, the method step 108 for the movement correction will then be carried out. The movement correction can comprise the storage of the movement data of the patient 15, such that the movements made by the patient 15 during the magnetic resonance examination will only be taken into account during an evaluation of the magnetic resonance examination, and will be integrated into the evaluation of the magnetic resonance data. In this situation, the movement data will be stored together with the magnetic resonance data from the magnetic resonance examination.

Additionally, it may also happen that the movement correction also comprises a change in a measurement sequence of the magnetic resonance examination. The change may comprise an adjustment and/or a change to one or more gradient sequences, such as, for example, an alteration to the magnetic field gradient, such that the magnetic resonance examination can always be carried out in the correct projection.

The change and/or adjustment of the magnetic field gradient can also take place in real time or almost-real time, wherein, before each magnetic field gradient pulse, a position and/or a movement of the patient 15 is again determined, and from this a corresponding correction value and/or offset of the magnetic field gradient is calculated. This correction value and/or offset remains the same for a duration of a magnetic resonance pulse.

Moreover, the movement correction can also comprise a measurement interruption, wherein, after the measurement interruption, the magnetic resonance examination and/or a part region of the magnetic resonance examination is restarted. At the same time, in this situation the clinical personnel overseeing the magnetic resonance examination also receive a warning message via the output unit 22, wherein this warning message is generated by the system control unit 21. In this way, a magnetic resonance measurement which is unclear and/or blurred due to a patient movement can be identified at an early stage and interrupted.

As soon as the magnetic resonance examination of the patient 15 is ended, the method for the determination of the movement of the patient 15 during the magnetic resonance examination is also ended. To do this, the method exhibits the interrogation 110, by means of which an end of the magnetic resonance examination on the patient 15 is determined.

The invention claimed is:

1. A magnetic resonance unit, comprising:
   a housing unit;
   a patient accommodation area for accommodation and/or holding of at least one part region of a patient for a magnetic resonance examination;
   a first movement sensor unit for acquiring a first item of movement information of a movement of the patient; and
   a second movement sensor unit for acquiring a second item of movement information of the movement of the patient,
   wherein the patient accommodation area is at least partially surrounded by the housing unit, the first movement sensor unit, and the second movement sensor unit,
   wherein the first movement sensor unit exhibits a first field of view for the acquisition of a first part region of the patient and/or of the patient accommodation area,
   wherein the second movement sensor unit exhibits a second field of view for the acquisition of a second part region of the patient and/or of the patient accommodation area that is arranged differently to the first part region of the patient and/or of the patient accommodation area,
   wherein the first and the second movement sensor units are arranged outside of the patient accommodation area,
   wherein the first and the second movement sensor units are arranged on the housing unit in an area on a side facing away from the patient accommodation area, and
   wherein the first movement sensor unit and/or the second movement sensor unit acquires at least one item of movement information of the movement of the patient by a run-time measurement of at least one sensor signal.

2. The magnetic resonance unit as claimed in claim 1, wherein the first and the second movement sensor units are arranged outside the patient accommodation area.

3. The magnetic resonance unit as claimed in claim 1, wherein the first movement sensor unit and/or the at least one second movement sensor unit comprises an optical movement sensor unit, and wherein the optical movement sensor unit comprises at least one optical 1D movement sensor element or an optical 2D movement sensor element.

4. The magnetic resonance unit as claimed in claim 1, wherein the first movement sensor unit and/or the second movement sensor unit comprises an ultrasound sensor unit.

5. The magnetic resonance unit as claimed in claim 1, wherein the first movement sensor unit and/or the at least one second movement sensor unit acquires an item of movement information of the movement of the patient by an optical pattern.

6. The magnetic resonance unit as claimed in claim 1, wherein the first movement sensor unit and/or second movement sensor unit acquires an item of movement information of the movement of the patient with a resolution of maximum 5 mm.

7. The magnetic resonance unit as claimed in claim 1, further comprising an evaluation unit.

8. A magnetic resonance apparatus with a magnet unit, comprising:
   a main magnet;
   a gradient coil unit;
   a high-frequency antenna unit;
   a housing unit;
   a patient accommodation area at least partially surrounded by the housing unit;
   a patient holding apparatus movably arranged inside the patient accommodation area; and
   a movement sensor unit for acquiring a movement information of a movement of the patient,
   wherein the first and the second movement sensor units are arranged outside of the patient accommodation area,
   wherein the movement sensor unit is arranged on the housing unit in an area on a side of facing away from the patient accommodation area, and
   wherein the movement sensor unit acquires at least one item of movement information of the movement of the patient by a run-time measurement of at least one sensor signal.

9. The magnetic resonance apparatus as claimed in claim 8, wherein the housing unit encloses the high-frequency antenna unit, and wherein the movement sensor unit is arranged in an area of the high-frequency antenna unit.

10. The magnetic resonance apparatus as claimed in claim 8, wherein the housing unit encloses a local magnetic resonance coil apparatus, and wherein the movement sensor unit is arranged between an inner housing unit and an outer housing unit of the local magnetic resonance coil apparatus.

11. The magnetic resonance apparatus as claimed in claim 8, wherein the housing unit at least partially encloses the patient holding apparatus, and wherein the movement sensor unit is arranged inside the patient holding apparatus.

12. A method for determining a movement of a patient during a magnetic resonance examination, comprising:
   acquiring magnetic resonance data before the magnetic resonance examination by a magnet unit;
   evaluating the magnetic resonance data for determining a three-dimensional spatial arrangement of an object arranged inside a patient accommodation area;
   determining a distance from a movement sensor unit to a patient inside the patient accommodation area from the three-dimensional spatial arrangement;
   acquiring sensor data by the movement sensor unit during the magnetic resonance examination;
   determining the movement of the patient on based on the acquired sensor data;
   checking a plausibility of the movement of the patient after determining the movement of the patient; and
   correcting the movement of the patient if the plausibility of the movement of the patient fulfills a plausibility criterion, wherein the movement sensor unit acquires at least one item of movement information of the movement of the patient by a run-time measurement of at least one sensor signal.

13. The method as claimed in claim 12, wherein the sensor data is acquired by at least two movement sensor units positioned differently in relation to the patient.

14. The method as claimed in claim 12, wherein the movement of the patient is calculated by a model calculation and/or a fitting method, and wherein the acquired sensor data and the three-dimensional spatial arrangement are included in the model calculation and/or in the fitting method.

15. The method as claimed in claim 12, wherein the acquired sensor data is taken into consideration one after another for temporally checking the plausibility.

16. The method as claimed in claim 12, wherein the movement correction is carried out as a function of the acquired sensor data of the patient.

17. The method as claimed in claim 12, wherein the movement correction comprises corrections during evaluating the magnetic resonance examination, or wherein the movement correction comprises changes in a measurement sequence of the magnetic resonance examination.

18. The method as claimed in claim 12, wherein the acquired sensor data of the patient represents an actuation criterion and/or a start criterion for at least one part region of the magnetic resonance examination.

* * * * *